(12) United States Patent
Laycock et al.

(10) Patent No.: US 8,110,791 B2
(45) Date of Patent: Feb. 7, 2012

(54) IMAGING DEVICE

(75) Inventors: Leslie Charles Laycock, Chelmsford (GB); Vincent Andrei Handerek, Grays (GB)

(73) Assignee: BAE Systems plc, London (GB)

( * ) Notice: Subject to any disclaimer, the term of this patent is extended or adjusted under 35 U.S.C. 154(b) by 422 days.

(21) Appl. No.: 12/439,153

(22) PCT Filed: Aug. 13, 2008

(86) PCT No.: PCT/GB2008/050698
§ 371 (c)(1),
(2), (4) Date: Feb. 26, 2009

(87) PCT Pub. No.: WO2009/022178
PCT Pub. Date: Feb. 19, 2009

(65) Prior Publication Data
US 2010/0200736 A1 Aug. 12, 2010

(30) Foreign Application Priority Data

Aug. 16, 2007 (EP) ...................................... 07270042
Aug. 16, 2007 (GB) .................................. 0715998.1

(51) Int. Cl.
*G03B 13/16* (2006.01)
*G02B 27/10* (2006.01)
*H01L 31/0232* (2006.01)
*H01L 27/146* (2006.01)

(52) U.S. Cl. ................. 250/227.2; 250/227.28; 385/119; 385/120

(58) Field of Classification Search ............. 250/227.11, 250/227.2, 227.28, 227.29; 385/116, 119, 385/120
See application file for complete search history.

(56) References Cited

U.S. PATENT DOCUMENTS

| 3,666,347 | A | | 5/1972 | Kitano et al. |
| 4,099,833 | A | | 7/1978 | Tosswill |
| 4,139,261 | A | | 2/1979 | Hilsum |
| 4,641,931 | A | | 2/1987 | Loy |
| 4,815,816 | A | * | 3/1989 | Schneider ..................... 385/116 |
| 4,935,630 | A | | 6/1990 | Merchant |
| 5,004,328 | A | | 4/1991 | Suzuki |
| 5,015,844 | A | * | 5/1991 | Cole ......................... 250/227.24 |
| 5,136,675 | A | | 8/1992 | Hodson |
| 6,942,959 | B2 | * | 9/2005 | Dubin et al. .................. 430/321 |
| 7,010,202 | B1 | | 3/2006 | Graham |
| 7,286,295 | B1 | * | 10/2007 | Sweatt et al. ................. 359/619 |

(Continued)

FOREIGN PATENT DOCUMENTS

DE       3 525 518       7/1986

(Continued)

OTHER PUBLICATIONS

U.K. Patent Office, Search Report, Dec. 14, 2007, from related UK Patent Application No. GB 0715998.1, filed on Aug. 16, 2007.

(Continued)

*Primary Examiner* — John Lee
(74) *Attorney, Agent, or Firm* — Kenyon & Kenyon LLP

(57) ABSTRACT

An imaging device, particularly but not exclusively for use in a targeting sensor for missile seekers. The imaging device including at least one lens; a substantially planar sensor having a plurality of pixels; a light guiding arrangement for directing light received via said lenses toward said sensor; in which said light guiding arrangement includes a plurality of light guides.

16 Claims, 13 Drawing Sheets

U.S. PATENT DOCUMENTS

| | | | |
|---|---|---|---|
| 7,376,314 B2 * | 5/2008 | Reininger | 385/116 |
| 7,587,109 B1 * | 9/2009 | Reininger | 385/116 |
| 7,626,696 B2 * | 12/2009 | Zhang | 356/326 |
| 2003/0103744 A1 | 6/2003 | Koyama | |
| 2006/0236721 A1 | 10/2006 | Franck | |
| 2007/0237490 A1 * | 10/2007 | Reininger | 385/147 |
| 2008/0144179 A1 * | 6/2008 | Mimura et al. | 359/599 |
| 2010/0200736 A1 * | 8/2010 | Laycock et al. | 250/227.2 |

FOREIGN PATENT DOCUMENTS

| | | |
|---|---|---|
| EP | 0 326 200 | 8/1989 |
| EP | 1 167 991 | 1/2002 |
| FR | 2 252 043 | 6/1975 |
| GB | 2 112 244 | 7/1983 |
| JP | 2007 094 168 | 4/2007 |
| WO | WO 2001/025831 | 4/2001 |

OTHER PUBLICATIONS

European Patent Office, Search Report, Jan. 30, 2008, from related European Patent Application No. 07270042.0, filed on Aug. 16, 2007.
European Patent Office, International Search Report and Written Opinion, Jun. 10, 2008, from International Patent Application No. PCT/GB2008/050698, filed on Aug. 13, 2008.
European Patent Office, International Preliminary Report on Patentability and Written Opinion, Feb. 25, 2010, from International Patent Application No. PCT/GB2008/050698, filed on Aug. 13, 2008.

* cited by examiner

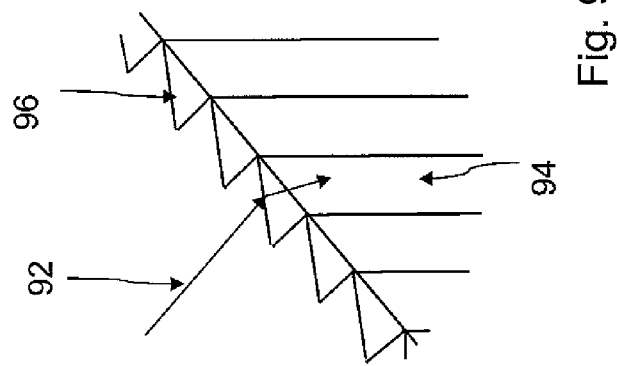
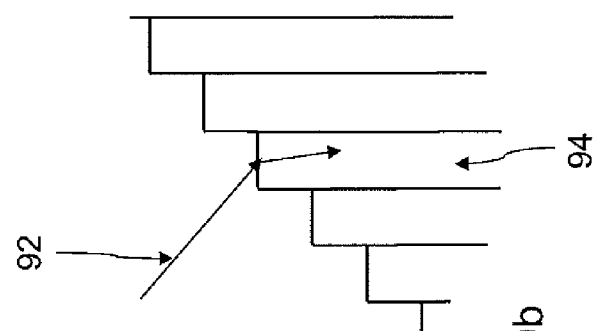
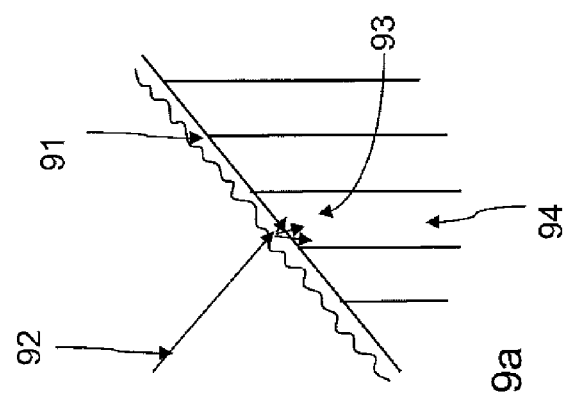
Fig. 9c
Fig. 9b
Fig. 9a

IMAGING DEVICE

RELATED APPLICATION INFORMATION

This application is a United States National Phase Patent application of International Patent Application No. PCT/GB2008/050698 which was filed on Aug. 13, 2008, and claims priority to British Patent Application No. 0715998.1, filed on Aug. 16, 2007, and claims priority to European Patent Application No. 07270042.0, filed on Aug. 16, 2007, the disclosures of each of which are incorporated herein by reference.

FIELD OF THE INVENTION

This invention relates to an imaging device, particularly but not exclusively to a miniature imaging device for imaging in the near infra-red region of the electromagnetic spectrum.

BACKGROUND INFORMATION

Modern silicon CCD and CMOS image sensors are becoming extremely small, so that the package size of commercial miniature cameras is becoming dominated by the image forming optics, even if the latter is only a structure supporting a pinhole. Recently, there have been demonstrations of ultra-flat, extremely light weight cameras working in the visible region of the spectrum. Such cameras are inspired by biological imaging systems. Similar ideas for cameras developed to operate in the infra-red would help to drastically reduce the size, weight and cooling requirements in many imaging applications, also offering substantial cost reductions. In addition, wide field-of-view designs can potentially simplify control systems that rely upon near infra-red imaging.

It is desirable to produce a near infra-red (NIR) imaging device with the following characteristics
  a capability to operate at 1064 nm.
  a total field of view of 120°
  a pixel resolution of ≦3 mrad A biologically inspired imaging device which is inspired by the construction of eyes in insects consisting of a segmented, convex sensor coupled to a similarly shaped microlens array might meet these requirements. To minimize size, this design would require a number of small individual sensor arrays to be closely packed at specific angles. However, such sensor design and manufacture is likely to be costly. In the longer term, sensors fabricated on flexible polymer substrates might provide a viable solution, but it is currently desirable to provide an imaging device which can use a conventional single planar sensor.

It is possible to use a planar sensor if beam deflection optics are used. If the beams are deflected prior to entering the lenses then a planar arrangement of lenses may also be used. One example in the holographic lenses proposed by Tai et al in 'Design and Fabrication of a Wide-Field Holographic Lens for a Laser Communication Receiver', A. M. Tai, M. T. Eismann and B. D. Neagle. Opt. Eng. 32 (12) 1993 pp. 3254 3266. This is illustrated schematically in FIG. 1 where a planar sensor 1 receives beams A, B, C via lenses 2 after deflection of beams A, C, by holograms 3. However in order to obtain high deflection efficiencies over a wide field of view it would be necessary to further segment the holograms; this again would be complex and costly.

As an alternative to holograms, prisms may be used either to deflect the beams prior to entering the lens as illustrated schematically in FIG. 2 where a planar sensor 1 receives beams A, B, C via lenses 2 after deflection of beams A, C, by prisms 4. Alternatively prisms may be provided at the sensor surface. However, prisms are bulky for manufacture and will cause chromatic aberrations. Furthermore, deployment at the sensor surface will tend to generate additional coma and astigmatism due to the converging beam as described in 'Formulas for the Coma and Astigmatism of Wedge Prisms used in Converging Light', J. W. Howard. App. Opt. 24 (23) 1985, pp. 4265-4268.

Therefore it is desired to produce an inexpensive miniature imaging device which has the characteristics described above.

SUMMARY OF THE INVENTION

According to the invention there is provided an imaging device including:
  at least one lens;
  a substantially planar sensor having a plurality of pixels;
  a light guiding arrangement including a plurality of light guides for directing light received via said at least one lens toward said sensor;
  in which said light guiding arrangement are shaped to direct light so that light from a central region in a field of view of the imaging device is detected by said sensor with a different angular resolution per pixel than for light from peripheral regions in the field of view.

The imaging device may include a plurality of lenses arranged such that the axes of two or more of the lenses converge; and said light guiding arrangement includes one or more fiber optical faceplates.

The light guiding arrangement may include a single fiber optic faceplate having one or more facets each facet receiving light from an associated lens.

Any surface of the faceplate with an angled surface which is not orthogonal to the longitudinal axis of the optical fibers may be modified in order to facilitate guiding of incoming light in order to overcome the fact that beam deviation due to refraction at the angled surface will be reduced.

In various embodiments the surface is modified by:
  providing a scattering surface on the surface of the light guides;
  providing a stepped surface on the surface of the light guides; or
  providing a prismatic thin film on the surface of the light guides.

In an exemplary embodiment the lenses are arranged to provide a field of view of π steradians. In this case, nine lenses may be arranged in a three by three matrix such that a cross section of the lens array is a third of a nine sided regular polygon.

In an exemplary embodiment a foveated sensor is simulated by segmenting the sensor and the light is guided from the lenses such that a higher resolution is obtained near the center of the sensor and a lower resolution is obtained near the periphery of the sensor.

In another embodiment of the invention the lens is a spherical lens and the light guiding mean includes a plurality of parallel light guides arranged to form a plate having a curved recess, the recess is arranged to receive an image plane portion of said lens, and to couple light received by said image plane to said sensor.

In this embodiment, the said lens may be a graded index lens. The light guiding arrangement may include a tapered fiber optic faceplate, wherein the degree of foveation in the imaging device is determined by the angle of taper in the fiber optic faceplate at the curved recess. In a further exemplary embodiment, the curved recess is modified such that each optical fiber has a light receiving surface which is orthogonal to the longitudinal fiber axis.

BRIEF DESCRIPTION OF THE DRAWINGS

FIG. 5a is an illustration of a first arrangement of a plurality of lenses for use in the present invention.

FIG. 5b is an exemplary illustration of a complex sensor arrangement for use with the lens arrangement of FIG. 5a.

FIGS. 9a, 9b and 9c illustrate different techniques for directing rays into a faceted fiber optic faceplate.

DETAILED DESCRIPTION

Exemplary embodiments of the present invention will now be described in more detail, by way of example only, with reference to the accompanying drawings.

Figure 2:
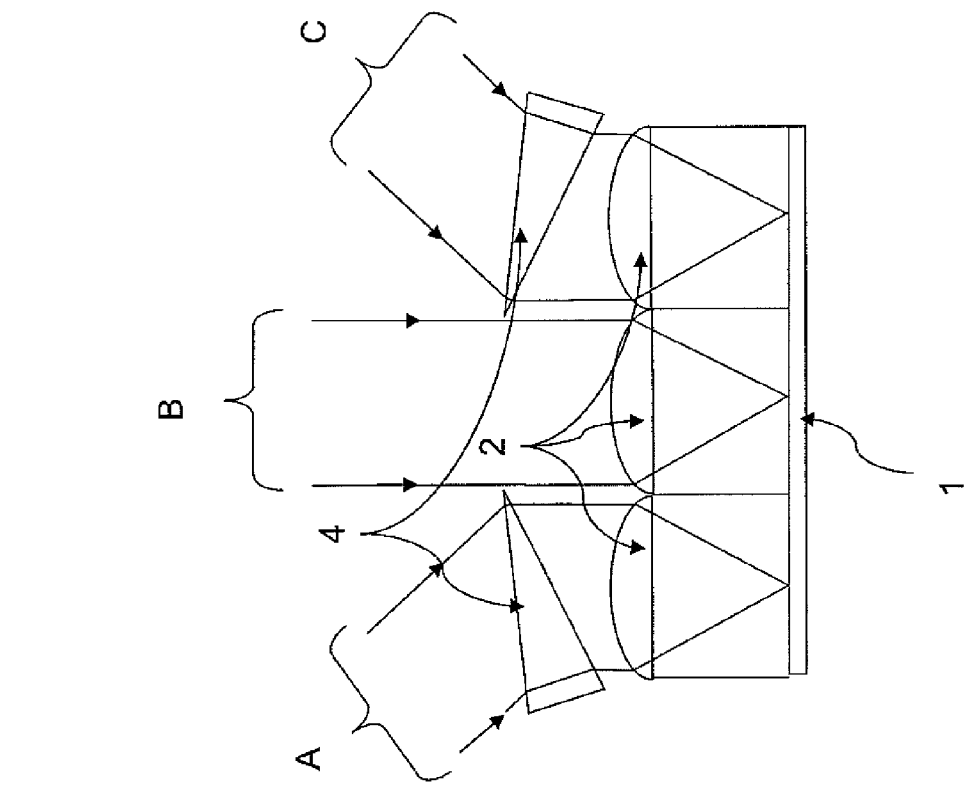
FIG. 2 is a schematic illustration of a prior art multi-lens imaging device employing prisms for beam deflection.
Figure 1:
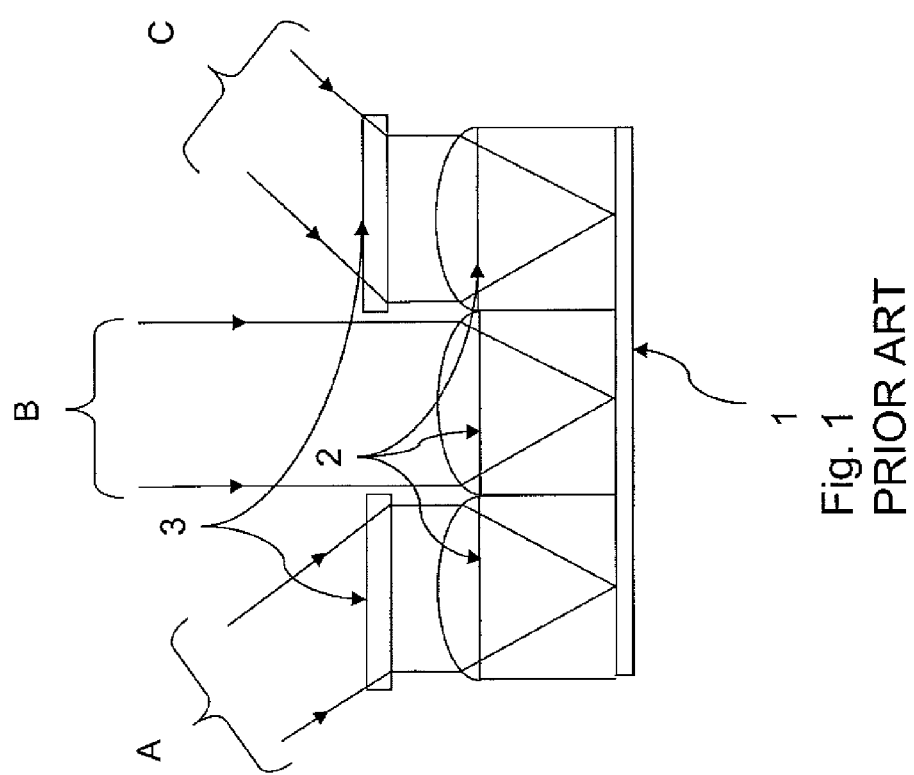
FIG. 1 is a schematic illustration of a prior art multi-lens imaging device employing holographic beam deflection.
Figure 3:
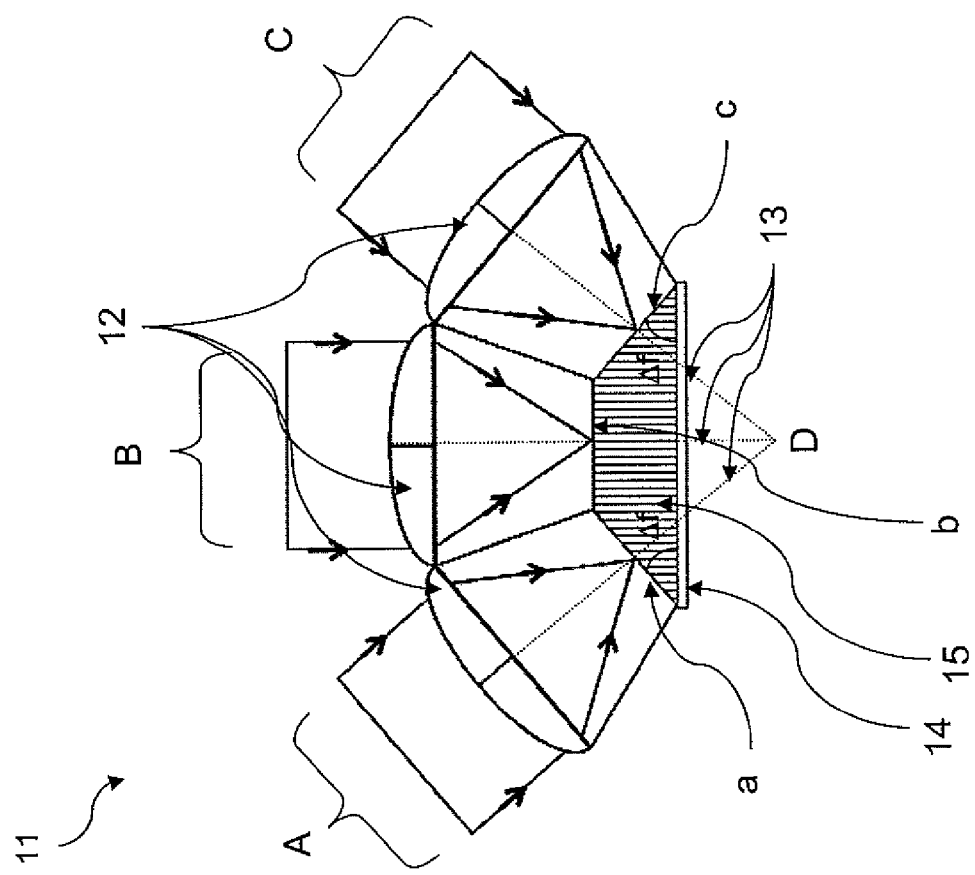
FIG. 3 is an illustration of an imaging device according to one embodiment of the present invention.

Referring now to FIG. 3, an imaging device 11 according to one embodiment of the present invention includes a plurality of microlenses 12 arranged such that the axis 13 of each of the microlenses converge at a point D, i.e. the microlenses point in different directions from one another to provide a wide field of view when the images received from the microlenses are combined. The microlenses are coupled to a substantially planar sensor 14 by light guiding arrangement 15 including a plurality of light guides, and which in the exemplary embodiment of the invention are provided by a fiber optic faceplate (FOFP). The fiber optic face plate 15 includes a number of facet surfaces a, b, c. Facet a receives incident light A, facet b receives incident light B and facet c receives incident light C. The fiber optic faceplate 15 has been ground to form facets a and c which create an angle Δf between the angled facet surfaces a, c of the faceplate, and the sensor 14. It will be appreciated that FIG. 3 illustrates figuratively a two dimensional section through a three dimensional imaging device which will be described in more detail below with reference to further Figures.

In this embodiment of the invention, incident light A and C is focussed onto a respective faceted surface a and c which is not orthogonal to the longitudinal axis of the optical fibers of the light guiding arrangement 15. This has two effects which will be discussed in more detail below: the first is that the image received from the off-axis beams A, C is compressed; and the second is that the coupling efficiency of the optical fiber may be compromised if the light receiving surface of the optical fiber itself is not orthogonal to the longitudinal axis of the optical fiber.

Figure 4:
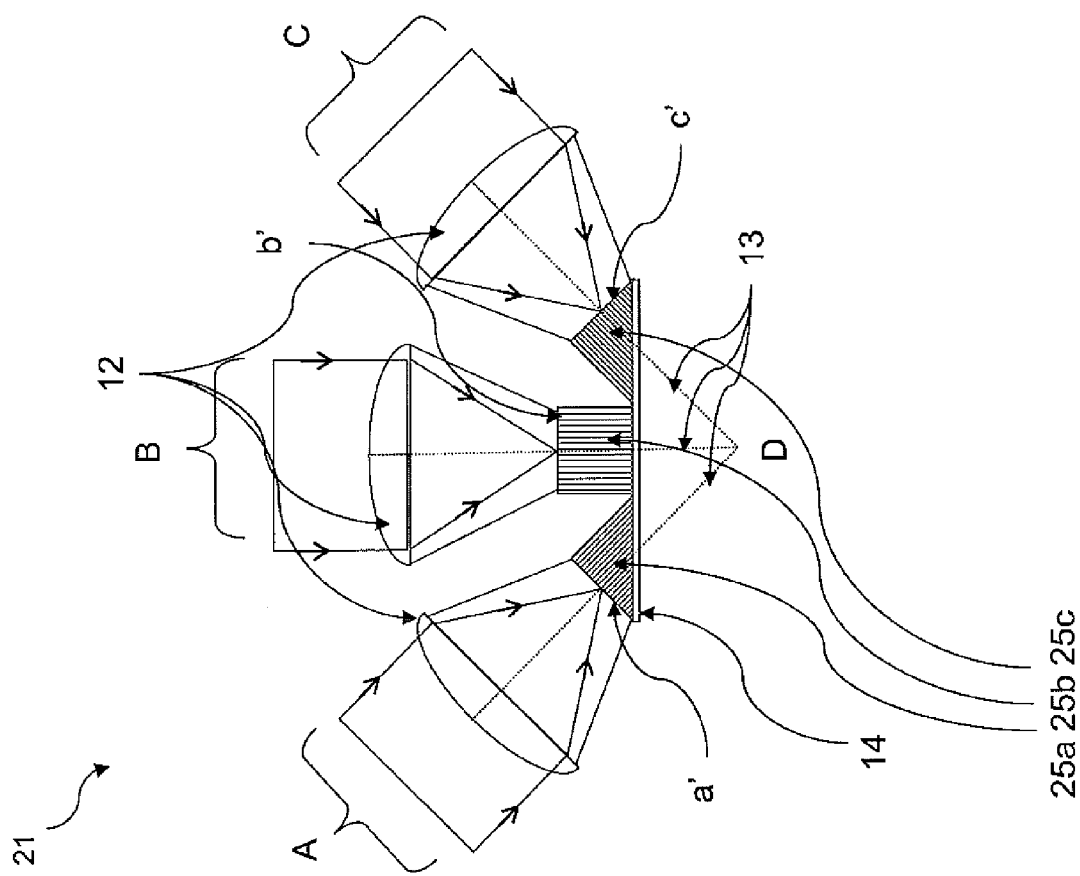
FIG. 4 is an illustration of an imaging device according to a second embodiment of the present invention.

An alternative embodiment of an imaging device 21 according to the present invention is illustrated in FIG. 4. In this figure features corresponding to those illustrated in FIG. 3 are indicated by the same reference numerals. The difference between the imaging device illustrated in FIG. 3 and that illustrated in FIG. 4 is that the light guiding arrangement 15 includes multiple faceplates 25a, 25b, 25c. In this embodiment surface a' receives incident light A, which is coupled to the sensor 14 by element 25a, surface b' receives incident light B which is coupled to the sensor 14 by element 25b and surface c receives incident light C which is coupled to the sensor by element 25c.

In this embodiment the receiving surfaces a, b, c of the fibers are parallel with the image planes and orthogonal to the longitudinal axis of the optical fibers forming the light guiding arrangement 15, thus maximising coupling efficiency for off-axis beams A, C. In this case the image received via the off-axis beams A, C is expanded in relation to the image received via beam B.

The details of the configuration of the microlenses 12, the sensor 14 and the light guide arrangement 15 in the exemplary and other embodiments will be discussed further below.

Figures 5A, 5B:
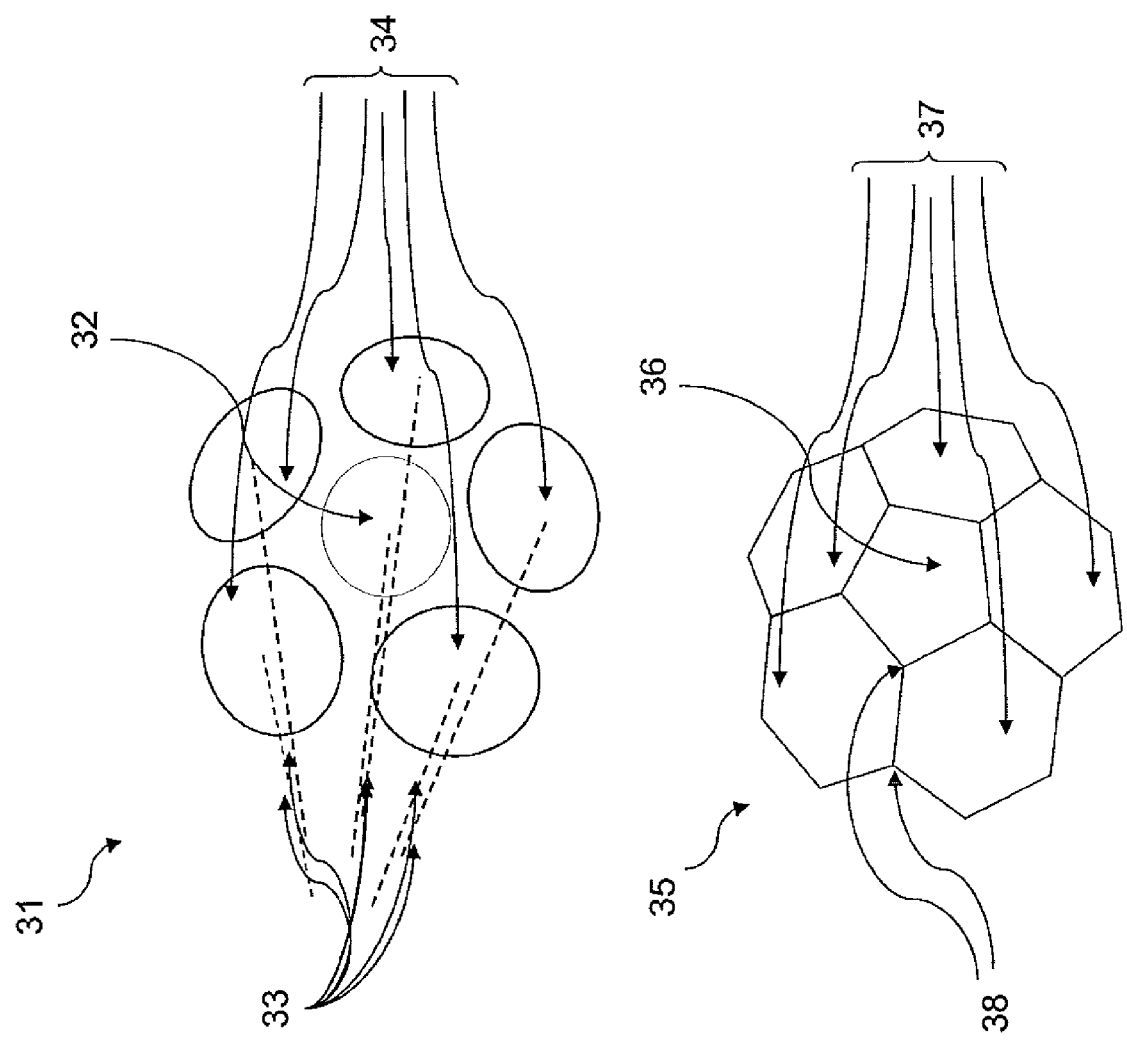

FIG. 5a illustrates an arrangement of a plurality of lenses 31 in one embodiment of the present invention. This arrangement is a biologically inspired configuration which is particularly efficient in delivering a wide field of view (FoV).

A central lens 32 is surrounded by five lenses 34. The axes 33 of each of the lenses converge at a central point (not shown).

This configuration may be served by a sensor array 35, illustrated schematically in FIG. 5b, including a portion of a truncated icosahedron. This shape is found in the construction of footballs and $C_{60}$ (buckyball) molecules and consists of a central pentagonal sensor 36 to receive light from the lens 32 surrounded by five regular hexagonal sensors 37 to receive light from the lenses 34. All the vertices 38 (only two labelled for clarity) of this sensor array 35 lie on a sphere. However, as discussed previously, an imaging device as shown in FIG. 5 is relatively expensive to construct and in certain applications a more cost-effective solution may be preferred.

Figure 6:
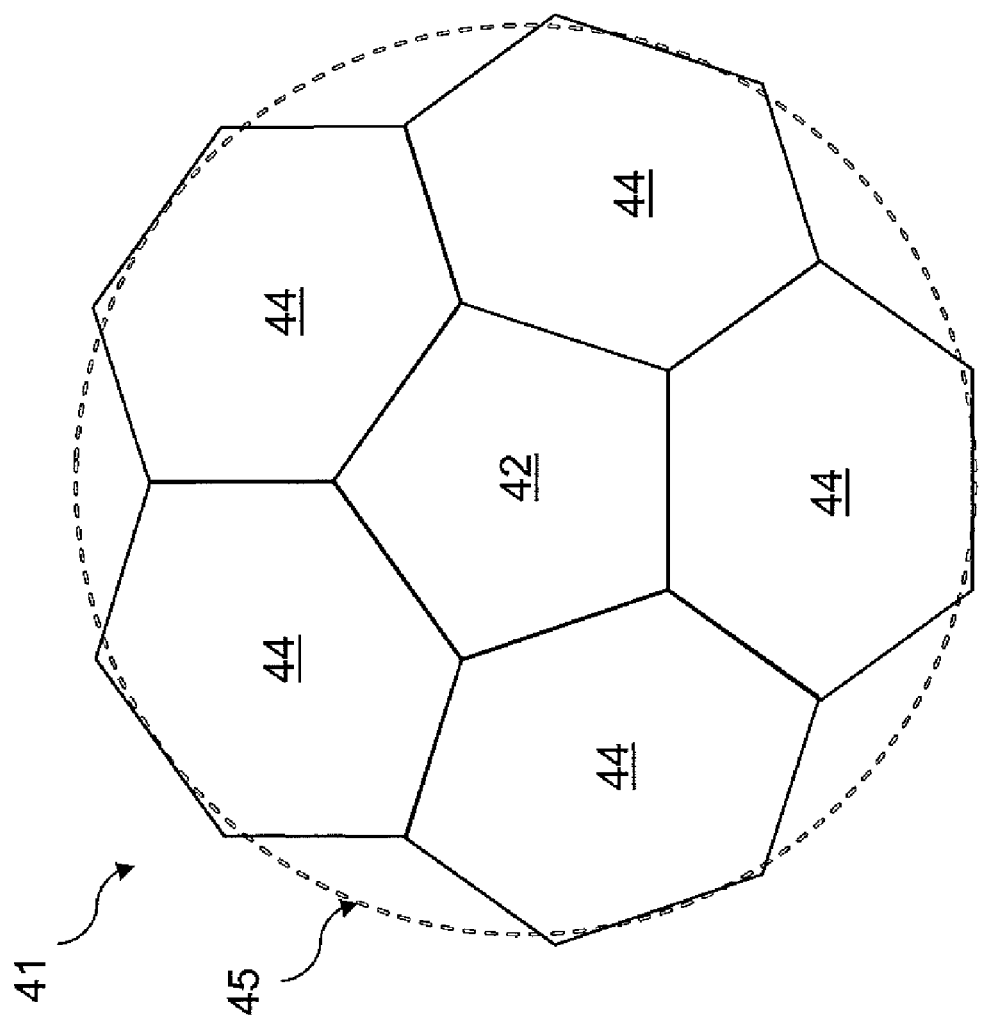
FIG. 6 is a plan view of a segmentation of a planar sensor for an imaging device having the lens configuration illustrated in FIG. 4.

By using beam deflection optics, such a convex arrangement of sensors angled in relation to one another as described above with reference to FIG. 5b may conveniently be replaced by a single, planar sensor. A single planar sensor would be segmented optically and electronically in order to extract the multi-image data sensed from the lenses 32, 34. For the lens geometry shown in FIG. 5a, a sensor 41 having a segmented pattern as shown in FIG. 6 may be used. Segment 42 receives light from lens 32 and segments 44 receive light from lenses 34.

The dotted line 45 surrounding the segmented pattern of FIG. 6 corresponds to a FoV of 117°, which is close to an FoV of 120°. However, in general, commercially available sensors are rectangular (or square) and such an arrangement represents a poor use of the sensor's available pixels. It also makes subsequent image extraction and processing complex.

Figure 7B:
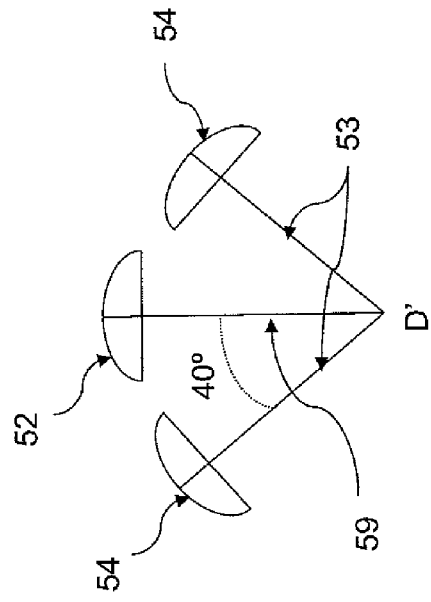
FIGS. 7a, 7b and 7c are a schematic illustrations showing a top view and cross sectional views of an exemplary arrangement of a plurality of lenses for use in the present invention.
Figure 7A:
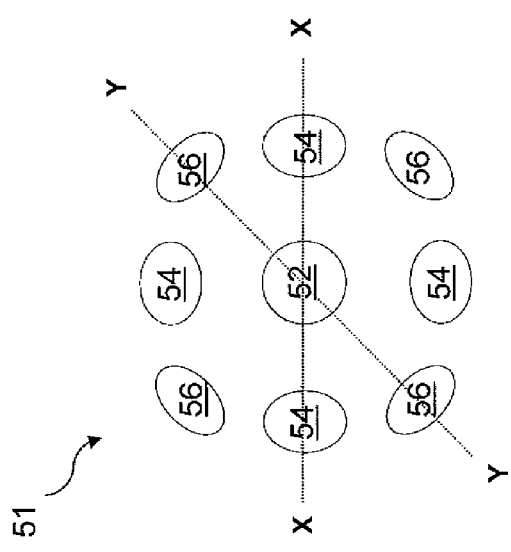
Figure 7C:
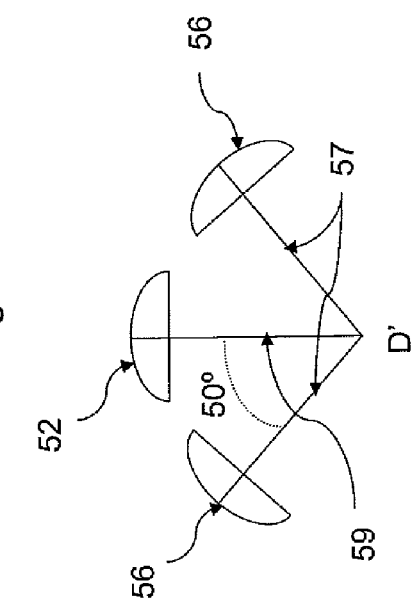

Therefore, an exemplary arrangement 51 of lenses is illustrated in FIGS. 7a-7c. FIG. 7a illustrates a top view of the lens arrangement; FIG. 7b illustrates a cross section of the lens arrangement though section X-X of FIG. 7a; and FIG. 7c illustrates a cross section of the lens array through section Y-Y of FIG. 7a. Referring to these figures, a central lens 52 is surrounded by four side lenses 54 which have an axis 53 converging with the axis 59 of the central lens 52 at a point D' and forming an angle of 40° thereto as illustrated in FIG. 7b. The cross section therefore forms one third of a nine sided polygon and this embodiment thus satisfies the FoV requirement of 120°. The central lens 52 is also surrounded by four corner lenses 56 each having an axis 57 forming an angle of 50° to the axis 59 of the central lens 52 and also converging at a point D' as illustrated in FIG. 7c.

This exemplary arrangement projects more conveniently onto a rectangular or square sensor, allowing the use of standard region of interest (ROI) post processing based on x,y coordinates.

Figure 8:
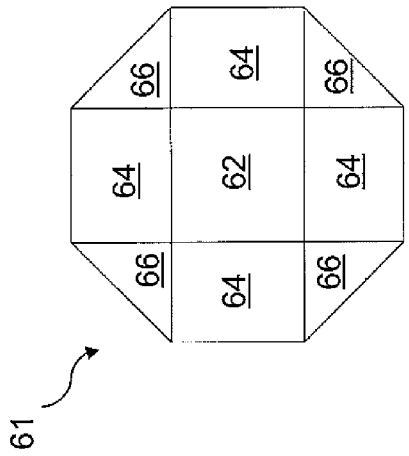
FIG. 8 is a plan view of a segmentation of a planar sensor for an imaging device having the lens configuration illustrated in FIG. 7.

FIG. 8 illustrates a sensor 61 having a segmentation pattern suitable for use with the exemplary arrangement of lenses shown in FIGS. 7a-7c. Central segment 62 receives image data via central lens 52, side segments 64 receive image data via side lenses 54 and corner segments 66 receive image data via corner lenses 56.

The corner lenses 56 and corner segments 66 provide triangular fields of view that enable the requirement for π steradian coverage to be met. However, the segmentation pattern shown is FIG. 8 is schematic; due to the inversion properties of the lenses, the triangular images optimally occupy the four corners of the sensor, thus making full use of the device.

The sensor 14 used in the exemplary embodiment of the present invention will now be discussed. The total number of pixels required is determined by the required FoV and required angular resolution. Given a target FoV of 120°, the corresponding solid angle coverage is ~π steradians. For a target angular resolution of approximately 2 mrad per pixel, it is convenient to use a sensor having dimensions of 1024× 1024 pixels which allows a central portion of a commercially available sensor in the SXGA (Super eXtended Graphics Array) format of 1280×1024 pixels to be used. In the exemplary embodiment a Cypress™ IBIS5-AE-1300 is used which also provides sensitivity at 1.064 µm; programmable windowing; high fill factor; large dynamic range; video frame rate and global shuttering.

The pixel size of the sensor in this exemplary embodiment is 6.7 µm which gives an active area for 1024×1024 pixels of 6.9×6.9 mm.

The lens 12 used in the exemplary embodiment will now be discussed. Using the equation: focal length=pixel size/angular resolution; it will be seen that the desired focal length of the microlens is 3.3 mm. However, in the exemplary embodiment a microlens with a slightly shorter focal length is chosen at the expense of a slight reduction in angular resolution in order to ensure a contiguous FoV from segment to segment, and to allow the use of baffles to reduce crosstalk. The lens used in the exemplary embodiment is a Lightpath™ 350330 which has a focal length of 3.1 mm.

In order to determine a preferred aperture, the lens was modelled using available aspheric constants data, and the results are given in Table 1. Here the modulation transfer function (MTF) obtainable at 75 lp/mm 6.7 µm pixel size) for rays parallel to the lens axis, and at field angles of 15° and 20° (the half angle FoV limit for each segment) are shown for two working apertures.

TABLE 1

Modelled MTF Values at a Resolution of 75 lp/mm for Incident Rays of 0°, 15° and 20°, and Full Apertures of 1.0 and 2.0 mm for Moulded Lightpath Lens Part Number 350330.

| | Working Aperture | | | | | |
|---|---|---|---|---|---|---|
| | 1.0 mm | | | 2.0 mm | | |
| Incident Angle | 0° | 15° | 20° | 0° | 15° | 20° |
| MTF | 0.7 | 0.50 | 0.14 | 0.85 | 0.25 | 0.07 |

It can be seen that for the smaller aperture, a respectable MTF of 0.5 can be obtained out to a field angle of 15°. For the larger aperture, the MTF would have reduced to 0.25 at this field angle.

As predicted by this modelling, in the exemplary embodiment the aperture of this single element lens is reduced to 1 mm in diameter in order to give the necessary performance.

In future it may be possible exploit advanced (multi-element) mobile phone lens designs to obtain improved off-axis performance at larger apertures.

Finally the light guiding arrangement 15 used in the exemplary embodiment of the present invention will be discussed. The light guiding arrangement 15 includes a fiber optic face plate (FOFP) which consists of a large number of closely packed optical fibers that have been fused into a coherent thin plate. Such faceplates find use in applications that require the relay of images from one plane to another, and commonly replace the cover glass of sensors for coupling and field flattening tasks. Although the image detector of the exemplary embodiment is directed towards use in the near infra red (NIR), devices for broad band infra red and in the long wave infra red (LWIR) region are also envisaged. Fiber optic faceplates in this spectral region are challenging, but capillary based devices can be used for relaying images, for example, hollow micro-capillaries coated with silver may be used. For the LWIR region, polymer devices offer a further option.

The choice of lens material is also an important consideration when operating in the IR regions of the spectrum. Lenses made from Zinc Selenide, Zinc Sulphide or Chalcogenide glass, in particular, are exemplary choices of material.

In the exemplary embodiment of the present invention a faceted optical fiber faceplate is used to relay images from angled lenses onto the planar sensor.

It is necessary to close-couple the faceplate to the unprotected sensor surface in order to maintain a focussed image and it is possible to match the faceplate resolution to that of the sensor.

One solution is to choose a fiber core size much smaller than the sensor's pixel in order to minimize the effect of the fiber core size on the resolution of the imaging device. If the fiber and pixel are of comparable size, an effect known as chicken wire will be seen as the two spatial distributions interfere, as in a Moire pattern. Such a fixed pattern noise can be mitigated by suitable post processing.

In the exemplary embodiment a faceplate manufactured by Schott™ having an element size of 6 μm and a very large numerical aperture (NA) of 1.0 is used.

In one embodiment of the present invention previously discussed and illustrated schematically in FIG. 4, a multi-element faceplate is used to ensure that the receiving surface of the fibers are parallel to the image planes and orthogonal to the longitudinal axis of the optical fibers, thus maximising coupling efficiency for off-axis rays A, C.

Referring back now to FIG. 3, in the exemplary embodiment a single element optical fiber faceplate which is simpler and more compact is used. However, the efficient detection of off-axis rays A, C will be discussed further below.

In this exemplary embodiment the images received via off-axis beams A, C are compressed due to beam deflection; this is exploited in the exemplary embodiment to allow greater sensor area to be allocated to the central segment, increasing angular resolution of the central segment at the expense of a lower angular resolution of the surrounding segments.

The images of the off-axis segments are compressed due to the beam deflection by a factor of cos Δf where Δf is the angle of the faceplate facet with respect to the sensor plane.

Referring back now to FIG. 8, in the exemplary embodiment having a total sensor area of 1024×1024 pixels, the central segment 62 occupies 404×404 pixels the surrounding side segments 64 each occupy 310×404 and the corner segments 66 each occupy 310×310 pixels.

As the FoV of each segment is 40°×40° the central area has an increased angular resolution of 1.7 mrad/pixel and the outer segments a slightly decreased resolution of 2.3 mrad/pixel. This multi resolution effect is similar to that which occurs in many biological image perception systems and is known as foveation.

Although the large NA of the chosen faceplate allows a relayed image to be clearly seen even when viewed at an angle of incidence of ~75°, when the faceplate is ground to form side and corner facets the light receiving surface of each optical fiber is not orthogonal to the longitudinal axis of the optical fibers, and as a result the coupling efficiency of the optical fibers may be reduced. This is due to the fact that if the individual fibers are angled, beam deviation at the surface of the fiber is reduced, and the propagating angle of the coupled beam may be less than the critical angle of the fiber and may not be reflected internally within the fiber.

Some form of surface modification may be used to enhance the coupling efficiency of the off-axis rays in this embodiment of the present invention.

Three exemplary surface modifications are shown in FIGS. 9a, 9b and 9c.

FIG. 9a illustrates an embodiment including a fabricated scattering surface 91 on the angled facets in order to increase the angular spread of the input rays. Light ray 92 is incident upon an optical fiber 94 at an angle which, due to the angled end of the fiber, may otherwise be coupled at an angle less than the critical angle of the optical fiber 94 and therefore fail to be reflected internally. The ray 92 is scattered into many rays 93, and thus enters optical fiber 94 at various angles some of which will be reflected successfully.

FIG. 9b illustrates an embodiment where the fiber ends are stepped so that the light receiving surface of the optical fiber 94 is orthogonal to the longitudinal axis of the optical fiber 94. Ray 92 will therefore be successfully reflected internally (and therefore transmitted by the optical fiber 94).

There is a challenge in the manufacture of this structure, as diamond machining can result in splintering or chipping of the faceplate. However, if the face plate is made from polymer material as discussed earlier then such plates may be diamond-machined to provide the 'terraced' profile necessary to enhance coupling into solid fibers.

FIG. 9c illustrates an embodiment which uses a commercial prismatic thin film, 96 for example, as provided by 3M™, to deflect an incoming ray 92 so that when it is deflected further by the angled surface of the optical fiber 94 it exceeds the critical angle and is reflected internally by the optical fiber.

An illustration of the exemplary embodiment of a final package 71 is shown in FIGS. 10a, 10b 10c and 10d. In this embodiment a dome shaped package 71 is machined from aluminium alloy.

Figure 10B:
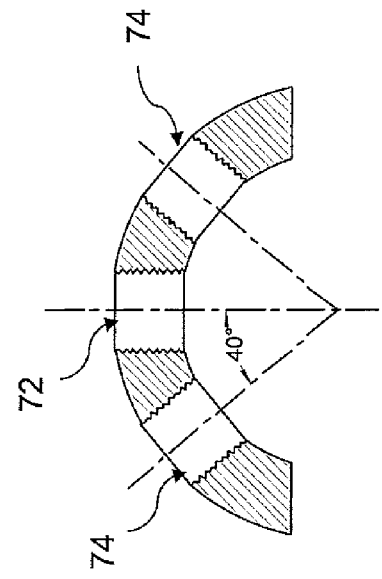
FIGS. 10a, 10b 10c and 10d illustrate one embodiment of a housing for the imaging device of the present invention.
Figure 10D:
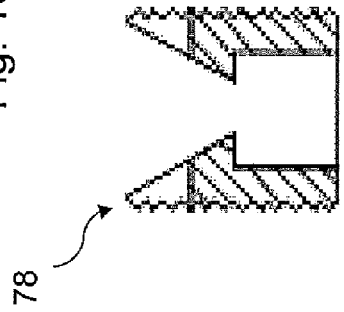
Figure 10A:
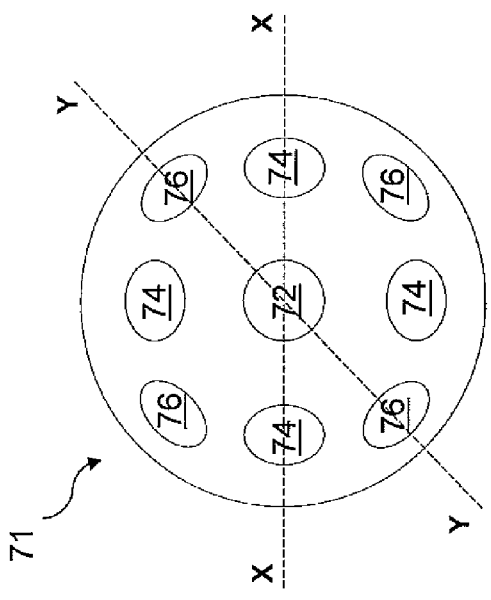
Figure 10C:
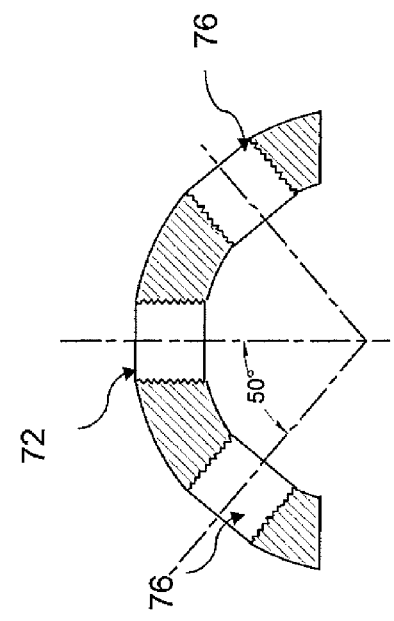

FIG. 10a illustrates a top view of the package, FIG. 10b illustrates a cross section for the package through section X-X of FIG. 10a, and FIG. 10c illustrates a cross section of the package through section Y-Y of FIG. 10a. Threaded apertures 72, 74, 76 are arranged to receive lenses 52, 54, 56 respectively after each lens is inserted into a threaded lens plug 78 machined from Delrin™ (black engineering plastic), one of which is illustrated in FIG. 10d.

The overall volume of this package including a sensor is less than 2 cm$^3$.

Figure 11:
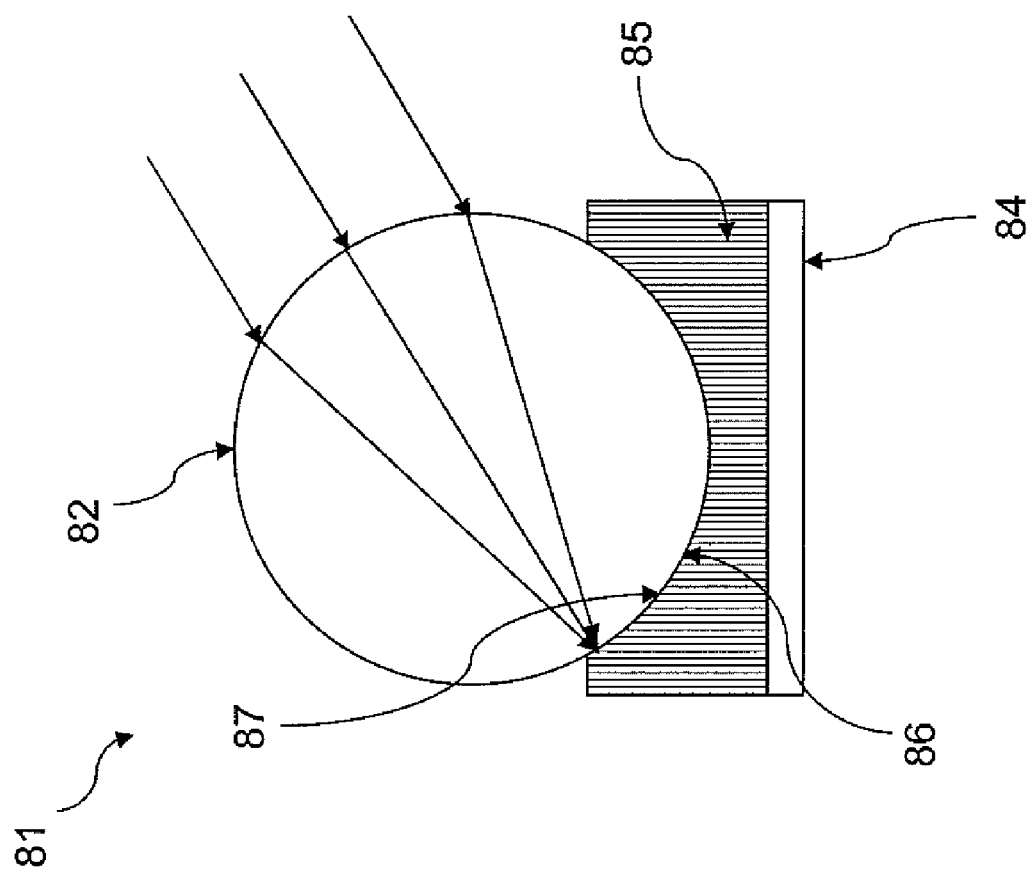
FIG. 11 is an imaging device according to a further embodiment of the present invention.

FIG. 11 illustrates a further embodiment of the present invention. In this embodiment the imaging device 81 includes a spherical lens 82 coupled to a substantially planar sensor 84 by a light guiding arrangement 85 having a recess 86 for receiving an image plane portion 87 of the sphere lens 82. In one embodiment of the invention the lens is a graded index lens that reduces spherical aberration and consequently improves image resolution. This embodiment also has an advantage that a foveated response is provided over a wide field of view as a consequence of the spherical to planar transformation provided by the spherical lens. The light guiding arrangement 85 may include an optical fiber faceplate, or a capillary based device. An optical fiber faceplate may be manufactured from glass or from polymer material. The recessed surface 86 may be modified as described previously in order to provide optical fibers having a scattering surface or a light receiving surface which is orthogonal to the longitudinal axis of the fibers.

As was discussed above with reference to FIG. 3, in an exemplary embodiment of the present invention, a greater proportion of the sensor 14 may be devoted to detecting and resolving a central segment of an image, represented by beam B in FIG. 3, than to detecting and resolving each of the surrounding segments, represented by beams A and C in particular. This multi-lens approach to providing a foveated lens in a imaging device is likely to have numerous applications where field of view needs to be improved without incurring disadvantages of increased size, weight and cost.

In one exemplary application to helmet mounted night vision goggles (HMNVGs), an exemplary embodiment of the present invention is able, with conventional optics, both to increase the field of view (FoV) and to reduce the weight of the sensor in comparison with prior art techniques. An exemplary imaging device suitable for use in this application will now be discussed in more detail with reference to FIG. 12.

Figure 12:
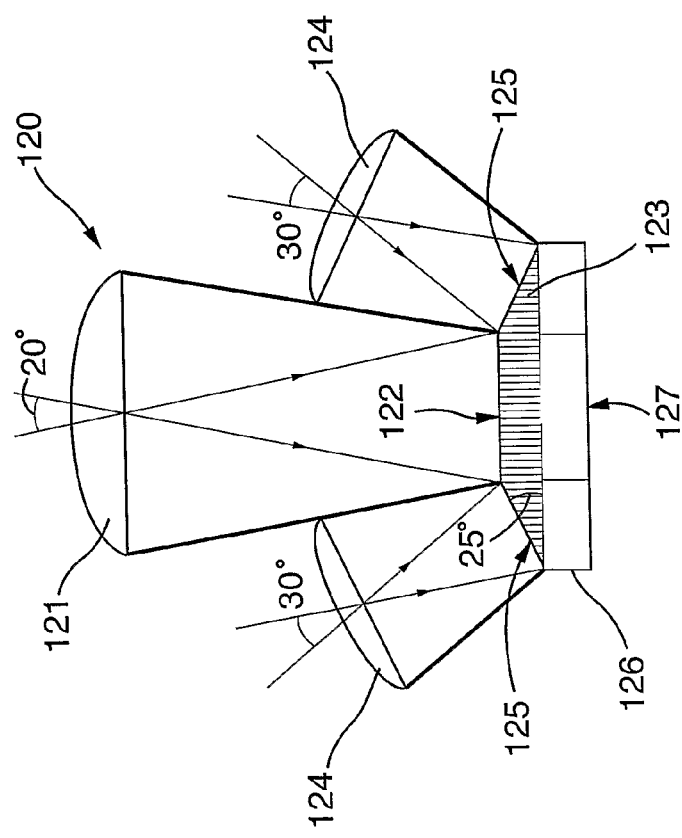
FIG. 12 shows an imaging device according to a further embodiment of the present invention that uses foveation of the image.

Referring to FIG. 12, a cross-sectional view is provided through a multi-lens imaging device 120 arranged to segment a required field of view (FoV) of 80° into a number of smaller sectors, each addressed by its own lens. In the imaging device 120, a central lens 121 is provided to focus an approximately 20° sector of the required 80° FoV onto a central region 122 of a faceted fiber optic face plate 123. An arrangement of lenses 124 surround the central lens 121, each lens 124 being of shorter focal length than the central lens 121 so as to focus an approximately 30° peripheral sector of the 80° FoV onto a respective inclined facet 125 of the fiber optic face plate 123. A lens arrangement corresponding to that described above with reference to FIG. 7*a* is possible. The faceted fiber optic face plate 123 directs the differently angled image planes of each of the lenses 121, 124 onto respective regions of a planar photocathode of an image intensifier 126.

In this exemplary arrangement, a central region 127 of the image intensifier 126, receiving light from the central lens 121 through the central region 122 of the fiber optic face plate 123, includes approximately half of the available aperture of the image intensifier 126. In reserving a greater proportion of the available aperture of the image intensifier 126, and hence of the available pixels in a CCD (not shown in FIG. 12) coupled to the image intensifier 126, for the central 20° sector of the FoV than for the peripheral 30° sectors, this arrangement provides a certain amount of foveation across the aperture of the imaging device 120. A variation in angular resolution across the FoV occurs in the human eye, so foveation in an imaging device applied to night vision goggles should appear relatively natural to a user.

In the particular example of the imaging device 120 in which the output of the image intensifier 126 may be coupled directly to a ⅔", high resolution (1360×1024 pixel) CCD as supplied for example by Sony under product reference ICX286, a resolution of approximately 0.5 mrad/pixel is achievable over the central 20° sector in the required FoV whereas, over each of the peripheral 30° sectors, the resolution is reduced to approximately 1.5 mrad/pixel. This option assumes that the image intensifier 126 employed is capable of matching the resolution afforded by the choice of CCD.

The inventors have established that, using current intensifier technology, image resolution cannot be maintained over a wider FoV without incurring penalties of increased weight and size. Whereas, in the longer term, the introduction of new intensifier technology may go some way towards providing a lightweight and low cost imaging device that maintains resolution across the full required FoV, in the shorter term, conventional optics may be replaced with more novel systems such as the imaging device 120 in this exemplary embodiment of the present invention. In this exemplary imaging device 120, the number of available pixels is better utilized by the use of foveation to extend the FoV in a lightweight and low cost imaging device 120 that is particularly suited to night vision goggles.

An image detected directly at the output of the image intensifier 126 will be distorted due to the differing magnifications in the different sectoral views provided across the aperture of the imaging device 120. However, using an arrangement as shown in FIG. 13, these distortions may be corrected for to provide a single level of magnification across the FoV for presentation to a user, in particular in a night vision goggles application.

Figure 13:
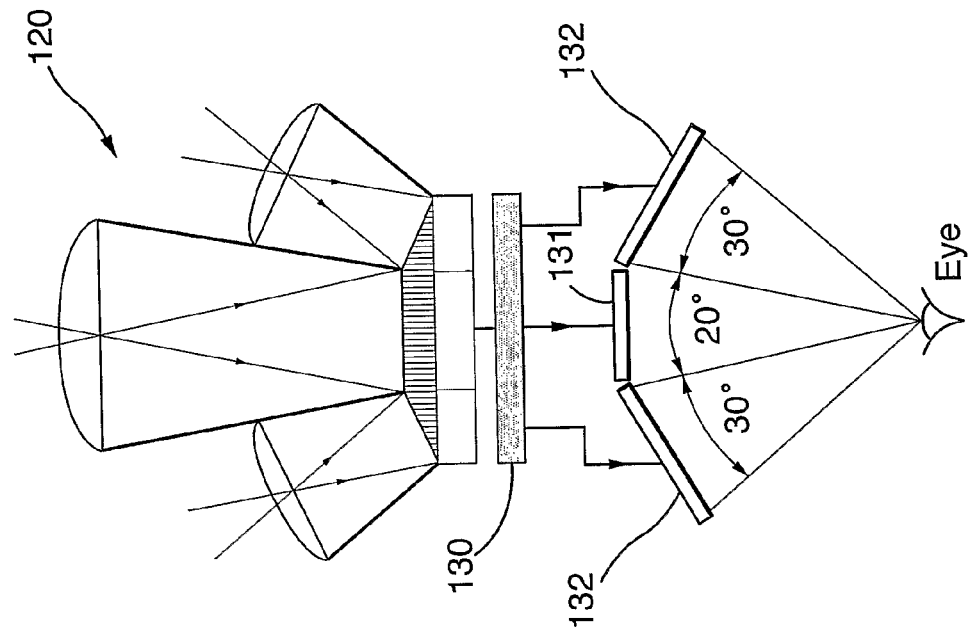
FIG. 13 shows the imaging device of FIG. 12 coupled to image processing and display equipment according to a further exemplary embodiment of the present invention.

Referring to FIG. 13, the imaging device 120 is shown coupled to an image processor 130 arranged to carry out image scaling and tiling of image portions detected from the different regions of the image intensifier so that when displayed on respective, differently angled display panels 131, 132, in night vision goggles for example, the central and peripheral sectors of the FoV are presented with the same magnification and orientation.

The use of multiple lenses permits greater flexibility in the design of an imaging device over single lens examples; for example the recent significant advances in digital camera lenses could be exploited to provide auto-focus and, additionally for the central lens 121, a zoom capability, whilst still retaining peripheral vision. However, one perceived drawback with this multi-lens approach is a sharp discontinuity in resolution between the central and outer sectors, that could result in human factors issues.

In a further exemplary embodiment of the present invention, an imaging device is provided that is based upon a sphere lens coupled to a tapered fiber optic face plate. This is conceptually simpler than the multi-lens system described above with reference to FIG. 12 and will now be described with reference to FIG. 14.

Figure 14:
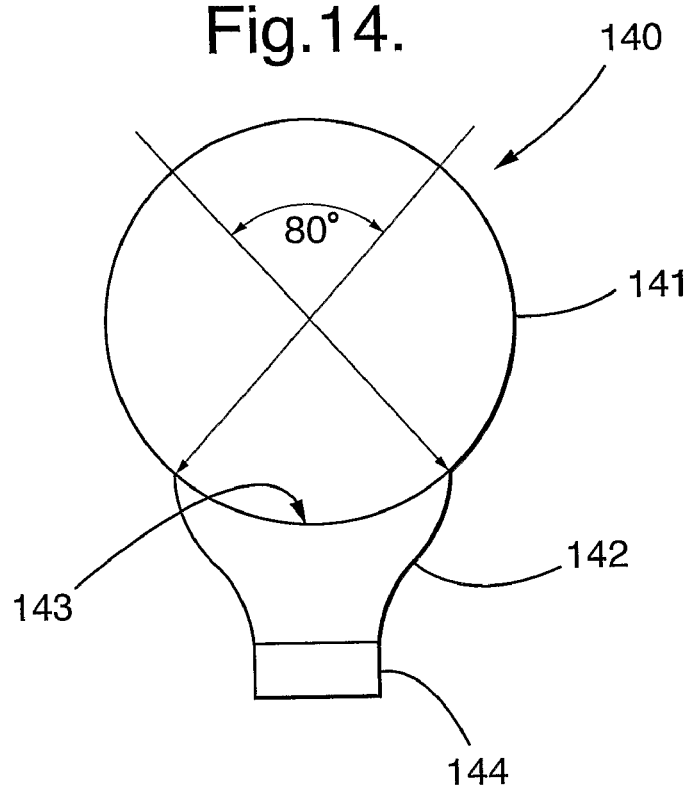
FIG. 14 shows an imaging device according to a further exemplary embodiment of the present invention using a uniform refractive index sphere lens and a tapered fiber optic faceplate.

Referring to FIG. 14, an imagining device 140 is shown in cross-section to include a spherical lens 141 having a uniform refractive index n=2, placed in contact with a tapered fiber optic face plate 142 having a spherically curved surface 143. The image surface of a spherical lens 141 with refractive index 2 is coincident with the surface of the lens. Therefore, the lens 141 may be placed in direct contact with the correspondingly shaped surface 143 of the tapered fiber optic face plate 142 so that a focused image will be channelled by the fibers in the fiber optic face plate 142 onto the planar photocathode of an image intensifier 144. Advantageously, there are no air gaps between the lens 141 and the tapered fiber optic face plate 142, making for a rugged imaging device 140. The lens 141 is however fixed in both focus and focal length.

In an exemplary embodiment, a graded index (GRIN) spherical lens may be used in an imaging device that will now be described with reference to FIG. 15.

Figure 15:
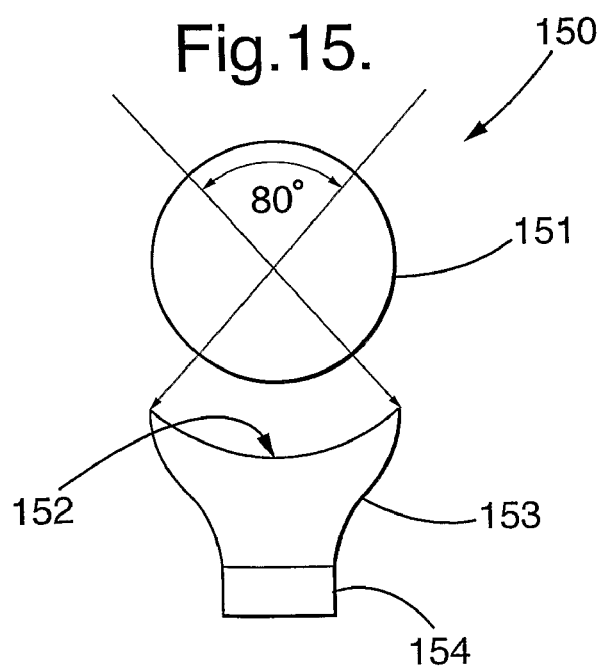
FIG. 15 shows an imaging device according to a further exemplary embodiment of the present invention using a GRIN sphere lens and a tapered fiber optic faceplate.

Referring to FIG. 15, an imaging device 150 is shown in cross-section to include a GRIN spherical lens 151 placed at a fixed distance from a spherically curved surface 152 of a tapered fiber optic face plate 153 so that the focal surface of the lens 151 coincides with the spherically curved surface 152. The focussed image is channelled to the planar photocathode of an image intensifier 154 by the fiber optic face plate 153. Use of the GRIN lens 151 would improve optical performance over the uniform refractive index spherical lens of the imaging device 140. However, in principle, lenses of lower refractive index are likely to be lighter in weight and less expensive.

The degree of foveation achieved in exemplary imaging devices of the present invention, in particular, depends on both the curvature of the lens surface and the taper of the fiber optic face plate. Two possible lens/taper configurations for exemplary embodiments of the present invention are shown in FIG. 16.

Figure 16A:
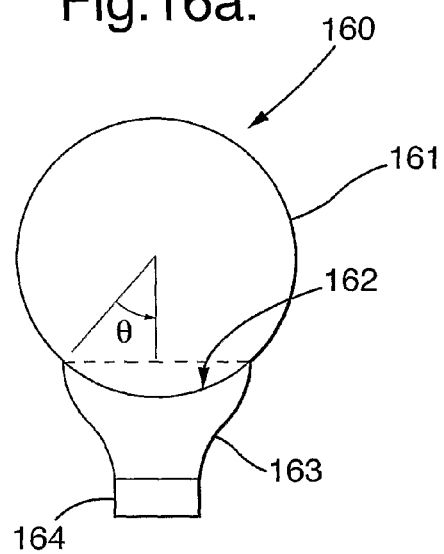
FIG. 16 and FIG. 17 illustrate principles in determining the foveation factor due to the taper of the fiber optic faceplate in exemplary embodiments of the present invention.
Figure 16B:
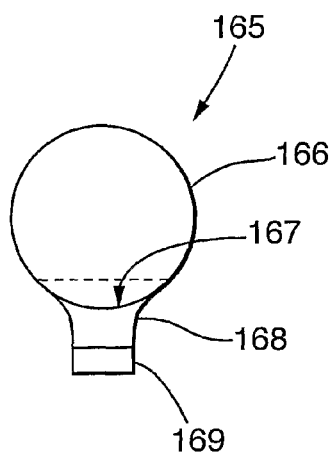

Referring to FIG. 16*a* and FIG. 16*b*, two imaging devices 160, 165 are shown in cross-section having spherical lenses 161, 166 respectively placed in contact with a spherical surface 162, 167 of a differently tapered fiber optic face plate 163, 168 which in turn channel a focussed image onto a planar image intensifier 164, 169 respectively. Not shown explicitly in FIG. 16, the lens 161 is positioned near the top of the taper in the fiber optic face plate 163 where the optical fibers are collimated and meet the spherical surface 162 in parallel with a central axis of the taper. However, the lens 166 is positioned at a lower position in the taper where the optical fibers meet the spherical surface 167 at an angle with respect to a central axis of the taper. The effect of the different tapers will now be analysed in detail with reference to FIG. 17 in which the various angles may be seen more clearly.

Figure 17A:
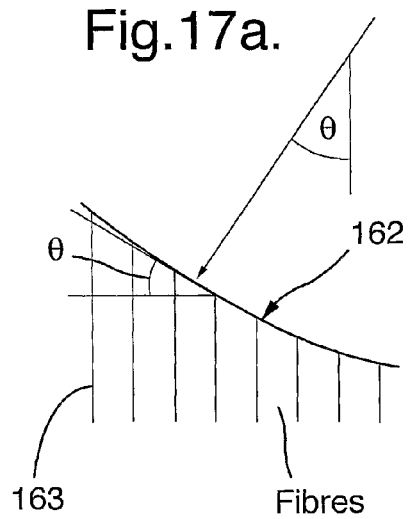
Figure 17B:
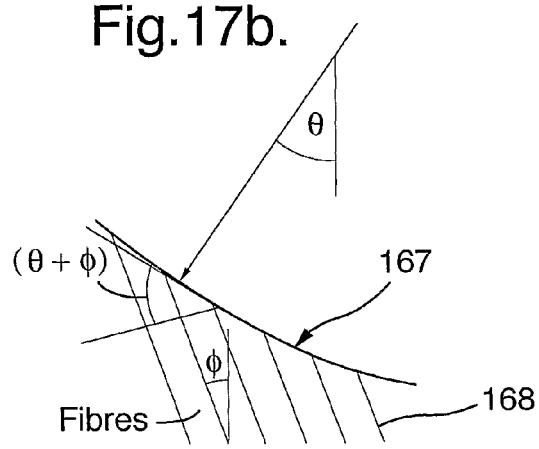

Referring to FIG. 17*a*, the fibers in the fiber optic face plate 163 of FIG. 16*a* are collimated and there is only a small (few percent) variation in fiber diameter between the center and edge of the fiber input face 162. In this configuration, the main foveation factor is due to the angle θ (which equals the field angle in this configuration) between the spherical fiber input face 162 and the fiber direction. This factor, f, is given by:

$$f = \frac{1}{\cos\theta}$$

and is approximately equal to 1.3 at the edge of an 80° FoV ($\theta$=40°). This value is quite modest and would not provide the degree of foveation necessary to make best use of the available pixels. In order to increase f, the lens/taper interface may be located in a position where the fibers are not collimated but vary in direction according to field angle $\theta$. The maximum variation occurs when the lens is embedded half way into the tapered region, as shown in FIG. 17b. In that case, the foveation factor is given by:

$$f = \frac{1}{\cos(\theta + \phi)}$$

where $\phi$ is the angle of the fiber direction with respect to the central axis of the taper at a field angle of $\theta$. For a typical value of taper magnification m=3 and a lens diameter equal to 1.04 times that of the large end of the original taper, the maximum value of $\theta$ ($\theta_{max}$) is the required 40°. The value of $\phi$ is dependent on $\theta$, m and the length of the taper.

Figure 18:
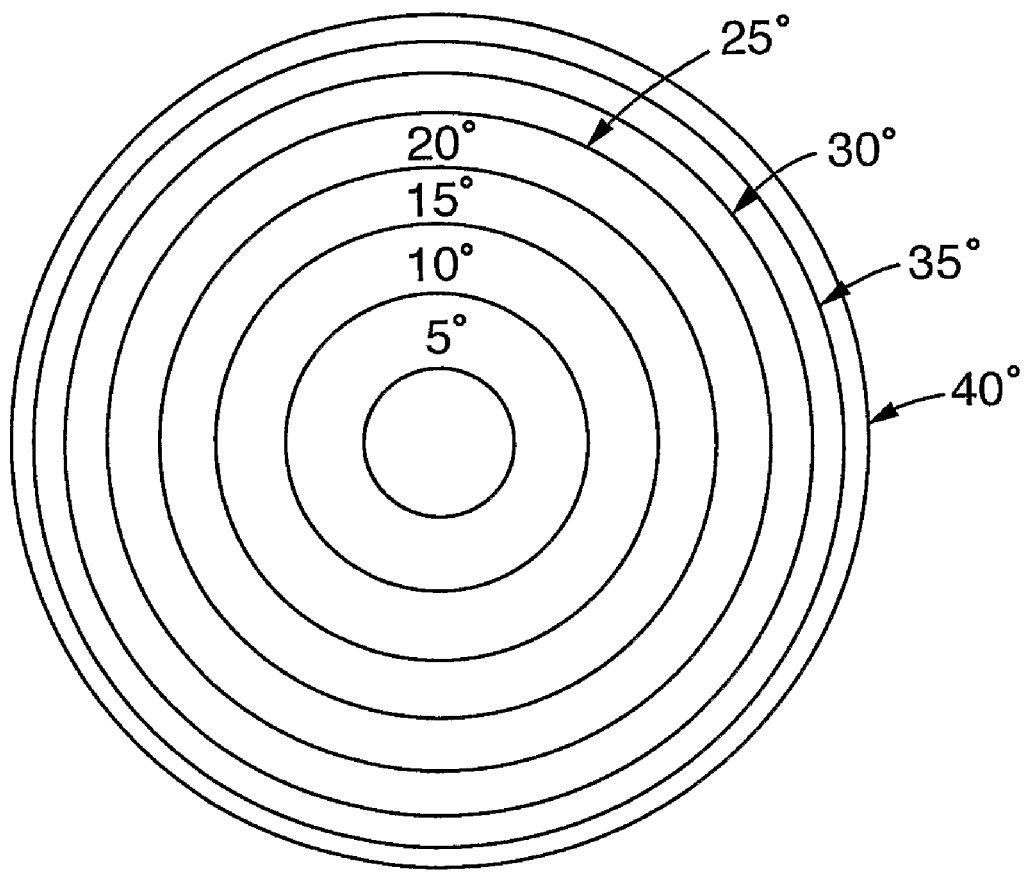
FIG. 18 shows the effect of an image foveation function, determined with reference to FIG. 17, in an imaging device according to an exemplary embodiment of the present invention.

The maximum value ($\theta_{max}+\phi_{max}$) can take is 90° when the fiber direction would be tangential to the lens surface; this would therefore be encountered when $\phi_{max}$ has a value of 50°. A more practical limit would be to set $\phi_{max}=\theta_{max}=40°$, resulting in a foveation factor of ~5.8 at the field edge. If it is assumed that $\phi$ varies linearly with radial distance from the central axis of the taper, then $\phi \approx \theta$ is a good approximation. Hence, $$f = \frac{1}{\cos 2\theta},$$

and this foveation effect is illustrated in FIG. 18 in which the angles shown are field angles. In this example, the length of the taper, L, and its maximum diameter, $D_t$, define $\phi_{max}$, namely:

$$\phi_{max} = \sin^{-1}\left[\frac{6LD_t}{D_t^2 + 9L^2}\right]$$

For a value of $\phi_{max}$=40°, L=0.9 D. This again is a practical value for a commercial taper.

The angular resolution $$\frac{d\theta}{dN},$$

where 2N is the total number of pixels in the horizontal FoV, is given by:

$$\frac{d\theta}{dN} = k/\cos 2\theta$$

where k is a constant.

∴

$$N = \left(\frac{1}{k}\right)\int_0^{40°} \cos 2\theta . d\theta$$

$$= \left(\frac{1}{2k}\right)\sin 80°$$

For the Sony CCD sensor referenced above, N=1360/2=680, giving k=7.2.10$^{-4}$. On axis ($\theta$=0), the angular resolution is therefore 0.72 mrad, and at $\theta$=40° this has been reduced to 4.2 mrad. On comparing plots of angular resolution as a function of field angle for the multi-lens and spherical lens embodiments of the present invention, it has been found that for a small sacrifice in on-axis resolution compared to the multi-lens case, the sphere lens provides better than 1 mrad/pixel resolution for FoVs in excess of 40°, and at the same time removes any sharp changes in resolution.

In the event that exemplary embodiments of the present invention described with reference to FIGS. 12 to 18 are to be used for imaging at IR wavelengths, then capillary fiber optic face plates and IR compatible lenses, in particular, as described above, are to be applied to these embodiments.

It will be appreciated that certain features of the invention, which are, for clarity, described in the context of separate embodiments, may also be provided in combination in a single embodiment. Conversely, various features of the invention which are, for brevity, described in the context of a single embodiment, may also be provided separately, or in any suitable combination.

It is to be recognized that various alterations, modifications, and/or additions may be introduced into the constructions and arrangements of parts described above without departing from the scope of the present invention as defined in the following claims.

The invention claimed is:

1. An imaging device for providing a large field of view comprising:
a plurality of lenses arranged such that the axes of two or more of the lenses converge;
a substantially planar sensor having a plurality of pixels;
a light guiding arrangement including at least one fiber optic faceplate and a plurality of light guides for directing light received via the plurality of lenses toward the sensor;
wherein the light guiding arrangement is shaped to direct light so that light from a central region in a field of view of the imaging device is detected by the sensor with a different angular resolution per pixel than for light from peripheral regions in the field of view,
wherein the at least one fiber optic faceplate includes at least one facet and each facet receives light from a corresponding lens,
wherein certain facets are angled to the planar sensor, such that incident light from a corresponding lens may be focused on a respective angled facet, and
wherein any surface of the faceplate with an angled surface, which is not orthogonal to the longitudinal axis of the optical fibers forming the faceplate, has the angled surface modified to facilitate guiding of incoming light.

2. The imaging device according to claim 1, wherein the light guiding arrangement includes a single fiber optic faceplate.

3. The imaging device according to claim 1, wherein the angled surface is modified by providing a scattering surface on the surface of the light guides.

4. The imaging device according to claim 1, wherein the angled surface is modified by providing a stepped surface such that each optical fiber has a light receiving surface which is orthogonal to the fiber axis.

5. The imaging device according to claim 1, wherein the angled surface is modified by providing a prismatic thin film on the surface of the light guides.

6. The imaging device according to claim 1, wherein the lenses are arranged to provide a field of view of substantially π steradians.

7. The imaging device according to claim 6, wherein nine lenses are arranged in a three by three matrix array such that a cross section of the lens array is one third of a nine sided regular polygon.

8. The imaging device according to claim 1, wherein the sensor is segmented and the light is guided from the lenses such that a higher resolution is obtained near the centre of the sensor and a lower resolution is obtained near the periphery of the sensor.

9. The imaging device according to claim 1, wherein the at least one lens has a focal length substantially equal to 3.1 mm.

10. The imaging device according to claim 1, wherein the at least one lens is a spherical lens and in which the light guiding mean comprise a plurality of light guides arranged to form a plate having a curved recess, the recess arranged to receive an image plane portion of the lens, and to couple light received at the image plane to the sensor.

11. The imaging device according to claim 10, wherein the lens is a graded index lens.

12. The imaging device according to claim 10, wherein the light guiding arrangement includes a tapered fiber optic faceplate and the degree of foveation in the imaging device is determined by the angle of taper in the fiber optic faceplate at the curved recess.

13. The imaging device according to claim 12, wherein the curved recess is modified such that each optical fiber has a scattering surface or a light receiving surface which is orthogonal to the longitudinal fiber axis.

14. The imaging device according to claim 1, wherein the sensor is provided by a 1024×1024 pixel matrix.

15. The imaging device according to claim 1, wherein the size of each light guide is substantially equal to or less than the sensor pixel size.

16. The imaging device according to claim 1, wherein the sensor pixel size is substantially equal to 6.7 μm.

* * * * *